United States Patent [19]
Bartley et al.

[11] Patent Number: 5,159,290
[45] Date of Patent: Oct. 27, 1992

[54] COMPOSITE WAVE CLOSURE MEANS FOR MICROWAVE CONTAINING REGIONS

[75] Inventors: Paul L. Bartley, Kensington, N.H.; Robert E. Myer, Denville, N.J.

[73] Assignee: AT&T Bell Laboratories, Murray Hill, N.J.

[21] Appl. No.: 686,219

[22] Filed: Apr. 16, 1991

[51] Int. Cl.$^5$ ............................ H03F 3/68; H03F 3/60
[52] U.S. Cl. .................................... 330/295; 330/286; 330/56; 333/125; 333/233
[58] Field of Search ............... 330/53, 56, 124 R, 286, 330/295; 333/125, 136, 137, 232, 233

[56] References Cited

U.S. PATENT DOCUMENTS 4,724,400  2/1988  Luettgenau ..................... 330/295
5,032,798  7/1991  Myer ............................ 330/295

Primary Examiner—James B. Mullins
Attorney, Agent, or Firm—Ruloff F. Kip, Jr.

[57] ABSTRACT

Apparatus is disclosed in which a ring of microwave amplifiers are spaced around the top of a cavity closure structure containing upper and lower splitter and combiner cavities. The inputs and outputs of the amplifiers are connected by, respectively, input and output coaxial couplers to points in, respectively, the splitter and combiner cavities which are spaced radially outward of, and equiangularly around the centers of these cavities. In operation, input microwaves are distributed by the splitter cavity and input couplers to the amplifiers to be amplified by them in parallel, and the several microwave outputs of the amplifies are merged together by the output couplers and combiner cavity to provide a single amplified output. On the upper and lower sides of the splitter and combiner cavities are rigid metal plates with flat surfaces facing towards these cavities, and on the lower and upper sides of the splitter and combiner cavities are sheet metal dishes. Fixed on the lower plate are concentric annular sheet metal bosses, forming together with that plate a composite metallic wall surface bounding the combiner cavity by an alternation of concentric ridges and valleys. Various of the sheet metal parts of the cavity closure structure have a circular circumferential flange seated in an annular groove in one or the other of the mentioned plates such that the rim of the flange projects into access holes intersecting those grooves, and the flange rim is angularly twisted in these holes to fasten the flange (and associated sheet metal part) to the plate. Various of the sheet metal parts are pierced by vertical apertures into which are press fitted bushings for receiving portions of the input couplers or output couplers. Each cavity may be tuned in resonant frequency by an insulative screw adapted by its turning to positively increase or decrease the vertical spacing at the center of the cavity between the metallic wall surfaces bounding its upper and lower sides.

19 Claims, 8 Drawing Sheets

COMPOSITE WAVE CLOSURE MEANS FOR MICROWAVE CONTAINING REGIONS

TECHNICAL FIELD

This invention relates generally to apparatus in which electromagnetic microwave energy is distributed via a divider cavity to a plurality of amplifiers, and is then amplified in parallel by these amplifiers, and in which the separate outputs from these amplifiers are then merged via a combiner cavity to provide a single amplified output of such energy from such apparatus. More particularly, this invention relates to improvements in such cavities and in the closure means therefor.

BACKGROUND OF THE INVENTION

On Feb. 9, 1988, U.S. Pat. No. 4,724,400, entitled "Linear Amplifier" was issued in the name of G. G. Luettgenau to TRW Inc. (the "400 patent"). Such patent is treated herein solely as a publication.

The '400 patent shows and describes a microwave splitter-combiner apparatus comprising a cylindrical stack of vertically superposed circular metallic plates defining within the stack an upper divider waveguide or cavity and a lower combiner waveguide or cavity. Each such cavity comprises a pair of vertically spaced metallic walls and a chamber between and bounded by such walls and providing a passage through which microwaves propagate, the chamber being essentially in the form of a horizontal cylindrical disc. In the divider waveguide, the microwaves travel through its cylindrical disc chamber from its center radially outward while, in the combiner waveguide, such travel in its chamber is radially inward towards the center of the chamber. Both of the cavities have metallic wall portions bounding the cavity in which are concentric ridges and valleys formed by milling of a thick plate providing that wall surface.

Disposed on a plate member providing a top closure for the mentioned stack is a set of twenty r.f. amplifier operating units. The twenty units are equiangularly spaced in carousel fashion around the top of such member in respective radial planes which are vertical and pass through the vertical axis of the stack.

Each of such twenty r.f. amplifier units is coupled to the splitter waveguide by an input coaxial connector and to the combiner waveguide by an output coaxial connector. In the operation of the apparatus, high frequency electromagnetic energy is fed to the splitter waveguide's center, travels therefrom radially outward through the waveguide's chamber to the twenty input connectors and is then fed upward by them to the twenty amplifiers which operate in parallel to amplify such energy. The amplified energy is then fed via the twenty output connectors to points in the combiner waveguide's chamber which are radially outward of the chamber's center. From those points the energy travels as waves radially inward through the chamber to its center to there be combined and provide an amplified output from the apparatus.

In the apparatus of the '400 patent, the divider and combiner cavities are bounded on the upper side of the upper cavity and the lower side of the lower cavity by respectively, a relatively thick rigid top metal closure plate and a similarly thick rigid bottom closure plate. The two cavities have between them a single central intermediate relatively thick rigid metal plate providing both the bottom closure wall for the upper cavity and the top closure wall for the lower cavity. That central plate is milled on its top side to provide concentric ridges and valleys facing towards the upper cavity. The bottom closure plate is similarly milled on its upper side to provide concentric ridges and valleys facing towards the lower cavity.

In co-pending U.S. patent application, Ser. No. 07/472,160, now U.S. Pat. No. 5,032,798 entitled "Improved Cavity Means For Microwave Divider-Combiner Units", filed Jan. 30, 1990 in the name of Robert E. Myer, one of the co-inventors hereof, and assigned to the assignee hereof, embodiments of microwave divider-combiner units are disclosed in which, in contrast to the '400 patent, unmilled metal plates are used to provide both the top metal closure wall for the upper cavity and the bottom metal closure wall for the lower cavity. As a further distinction from the '400 patent, the single central plate of that patent is replaced by two sheet metal plates which provide, respectively, the bottom and top metal walls bounding, respectively, the upper and lower cavity. In each of these sheet metal plates, the metal thereof is inflected by stamping or the like to form in such bottom and top walls respective sets of concentric ridges and valleys facing away from each other and towards the cavities bounded by such walls.

While these embodiments avoid the high milling costs of the plates used for the structure of the '400 patent and provide other advantages, the coaxial connectors in such embodiments which pass from the amplifiers to the lower cavity are of a length which desirably could be shortened. Moreover, even with the advances in the art provided by such embodiments, room remains to further lower the cost of fabricating the cavity closure structure.

SUMMARY OF THE INVENTION

In contrast to the considered embodiments disclosed in the aforementioned application, the invention hereof is according to one of its aspects, in the nature of cavity closure means of the sort described above in which at least one of the top, bottom and central wall means which bound the lower and upper cavities is a composite wall means comprising a horizontal metallic plate and a plurality of radially spaced annular rings on one side of such plate, each such ring comprising sheet metal inflected to form peripheral flanges at the radially opposite margins of the ring. The rings are disposed to form hollow annular bosses on the plate. The plate and bosses serve together to bound one side of a cavity within such closure means by a metallic wall surface having therein the described alternation of concentric ridges and valleys facing towards that cavity. When such composite wall means bounds the bottom side of the lower cavity, the coaxial connectors extending from the amplifier to that cavity may have a length lesser than that required for them in the considered embodiments of the mentioned patent application. Moreover, much of the milling costs of the cavity closure structure of the '400 patent is eliminated.

According to the invention in another of its aspects, sheet metal portions within the cavity closure means may be equipped with bushings for reception of coaxial connectors from the amplifiers, such bushings improving the electromechanical contact between such portions and such connectors. According to a further aspect of the invention, two horizontal wall means bounding vertically opposite sides of a cavity within the closure means are initially freely adjustable in relative horizontal positioning, are adjusted by aligning pins to an accurate desired relative horizontal positioning thereof, and are thereafter clamped in such positioning so as, by that aligning technique, to avoid the high cost incidental to obtaining such positioning by precision machining such two wall means in the instance where they are not so adjustable. As a still further aspect of the invention, cavity-tuning means may be provided to positively change in either direction the vertical spacing between radially central portions of the metallic wall surfaces bounding the vertically opposite sides of a cavity so as, thereby, to vary the tuning of that cavity.

BRIEF DESCRIPTION OF THE DRAWING

For a better understanding of the above described and other aspects of the invention, reference is made to the following description of a representative embodiment thereof, and to the accompanying drawings wherein.

DETAILED DESCRIPTION OF EMBODIMENT

Figure 1:
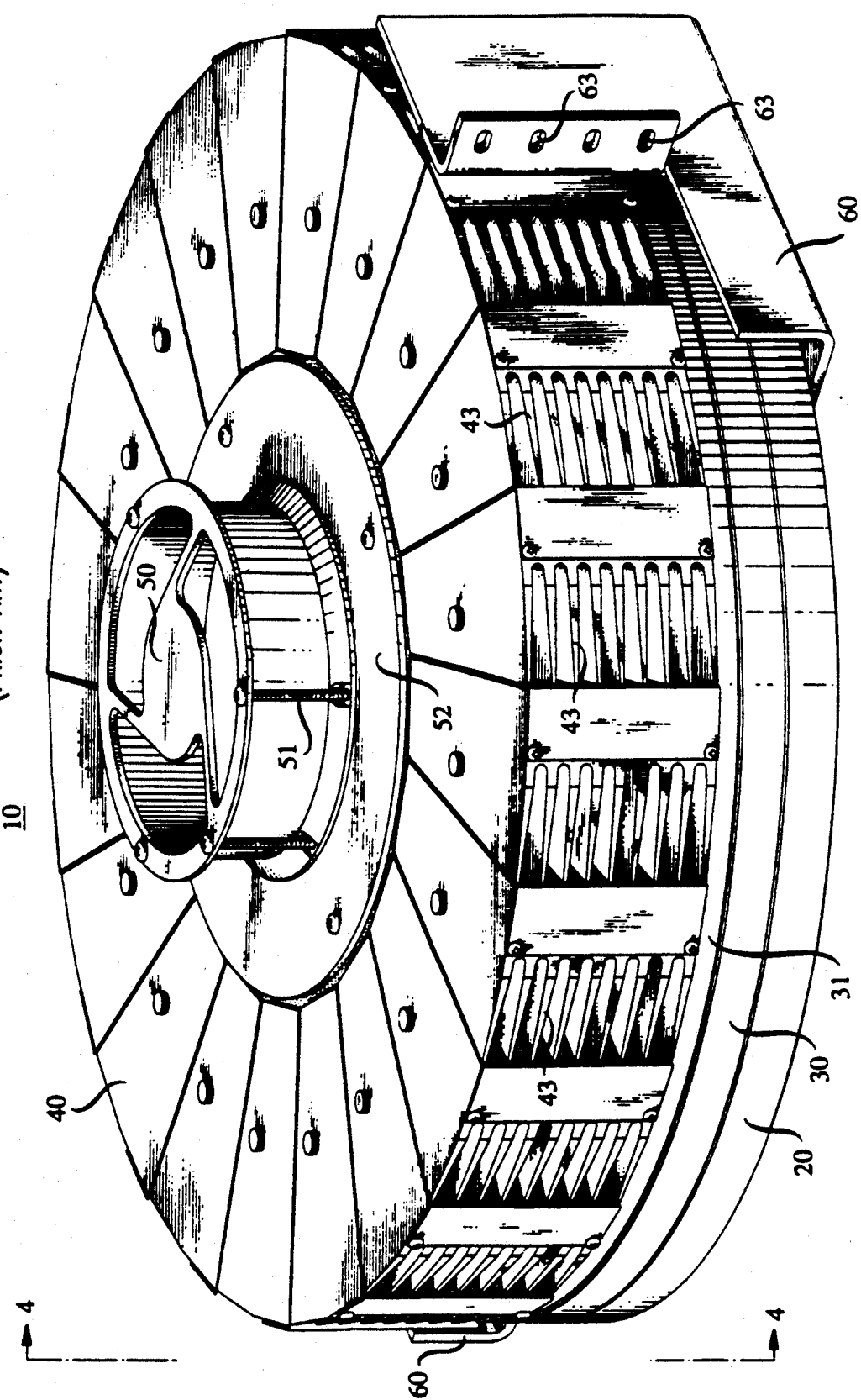
FIG. 1 is a perspective view of a microwave divider-combiner apparatus of a type to which the invention relates.

FIG. 1 is a perspective view of an assembled apparatus in the form of a power amplifier generally denoted as 10 in a which radial power divider cavity 30 is stacked on radial power combiner cavity 20 so that both are axially aligned. It is to be understood, however, that other stacking arrangements may be used. For example, divider cavity 30 may be placed beneath combiner cavity 20 so that the input and output connections of the amplifier structure are reversed. Amplifier 10 as shown in operative over the frequency range between 869 MHz and 896 MHz used in cellular telephone systems. It is to be understood however that the dimensions and shape of amplifier 10 may be adapted to operate over other frequency ranges. Wedge shaped amplifier modules 40 are disposed in radial fashion around the outer portion of the top cover plate 31 of radial power divider cavity 30. Each amplifier structure 40 includes a set of horizontal wedge shaped cooling fins 43 extending from each housing structure 40. Power supply connections to the amplifier device modules are not shown but can be readily placed on the top end of the amplifier device modules. Fan housing 50 is mounted above the central portion of divider cavity 30 on ring shaped plate 52. The fan in housing 50 forces ambient air across the horizontal fins 43 to remove heat from amplifier structures 40. As is readily seen, insertion and removal of amplifier housings 40 is completely independent of the air flow arrangements. Brackets 60 arranged on two sides of power amplifier 10 are attached to the bottom of combiner cavity 20 and have mounting holes 63 for attachment of amplifier assembly 10 to a frame not shown. While bracket mounting structures are shown in FIG. 1, it is to be understood that other mounting structures well known in the art may be used.

Figure 2:
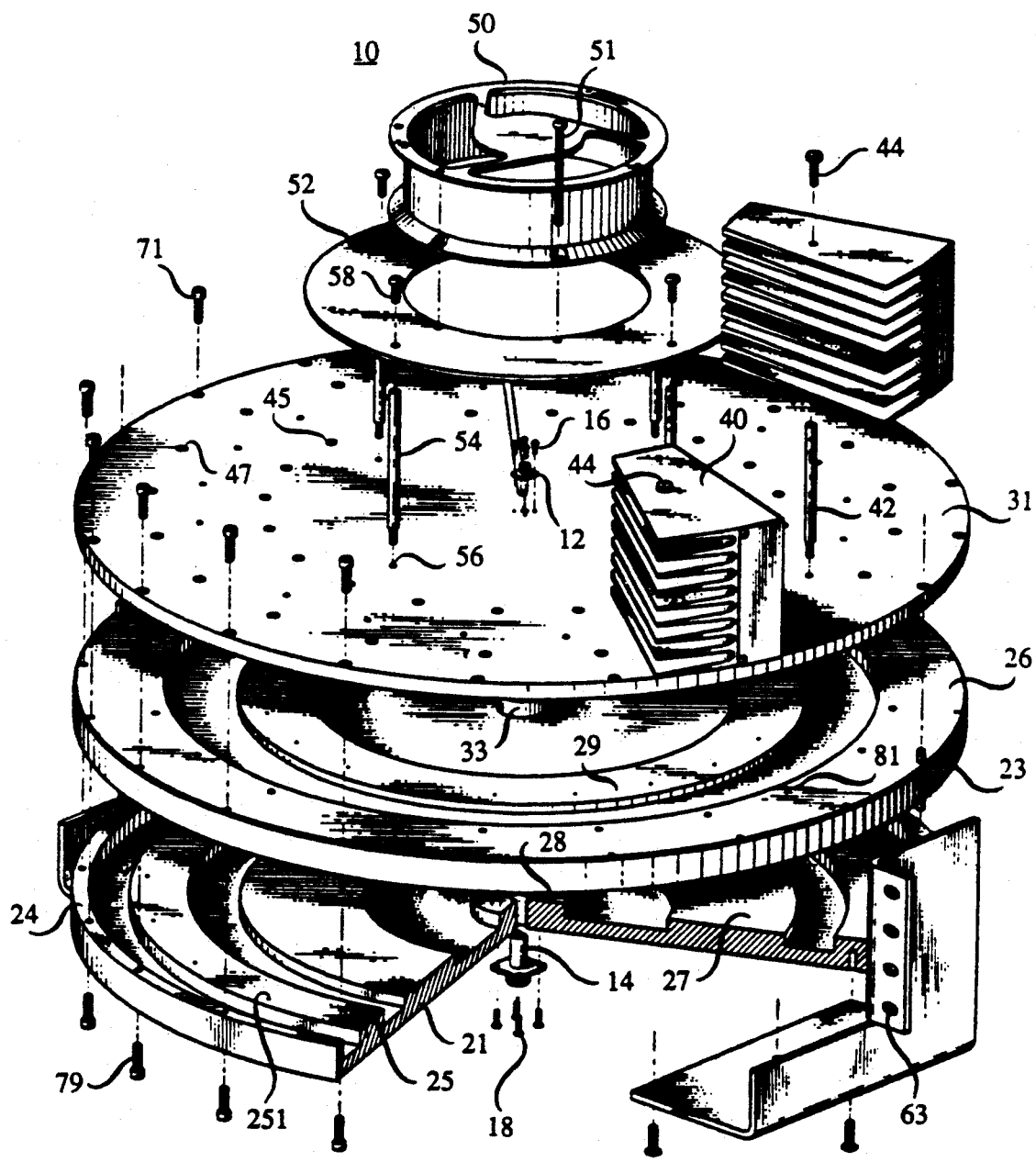
FIG. 2 is an exploded view of the apparatus shown in FIG. 1.

FIG. 2 is an exploded perspective view of amplifier structure 10. As shown in FIG. 2, combiner cavity 20 comprises circular bottom plate 21, the lower side of circular central plate 23 and outer cylindrical wall 24 extending peripherally upward from plate 21. The lower side of plate 23 is flat while the upper side of plate 21 includes a series of concentric ridges 25, 27 and 28. The ridges and valleys between plates 21 and 23 provide the electrical characteristics of combiner cavity 20. In particular, the narrow regions in the cavity formed between the ridges of circular plate 21 and the bottom of plate 23 correspond to capacitive elements while the wider regions in the cavity in between the ridges of plate 21 correspond to inductive elements. Similarly, divider cavity 30 comprises the upper side of circular plate 23, the lower side of flat circular cover plate 31 and outer cylindrical wall 26 extending upward from plate 23. Ridges 29 and 33 on the upper portion of plate 23 correspond to capacitive elements so that the prescribed electrical transmission characteristics are obtained. Although central plate 23 serves as the upper closure plate of cavity 20 and the lower closure plate of cavity 30, it is to be understood that the plate structure between the two cavities may comprise two separate elements as will be later described in more detail.

Circular plates 21, 23 and 31 are axially aligned and have the same diameter. Plate 31 is secured to the upper side of plate 23 by bolts 71 threaded into outer cylindrical wall 26 of plate 23 so that divider cavity 30 is formed. Plate 21 is secured to the lower side of plate 23 by threading bolts 79 into the periphery of plate 23 through outer cylindrical wall 24 of plate 21 whereby combiner cavity 20 is formed. Upper plate 31 of the divider cavity includes a set of apertures 45 arranged in a circular pattern for insertion of the input coaxial connector units of amplifying device modules 40 and a set of apertures 47 arranged in a circular pattern for insertion of the output coaxial connector units of amplifying device modules 40. Apertures 45 are circularly disposed at a first radial distance from a central port for plate 31 and apertures 47 are circularly disposed at a second radial distance greater than the first distance from such central port. While shown as having the second distance greater than the first distance, it is to be understood that the second distance may be smaller than the first distance so that input termination apertures are at a greater distance from the plate center than the output termination apertures.

Each aperture 45 is lined up radially with a corresponding aperture 47 for placement of one amplifying device module 40 on top of cover plate 31. While in position on upper plate 31, each amplifying device module 40 is secured thereto by a rod 42 passing through its horizontal fin structure 43 into plate 31 and bolt 44 threaded into the top of rod 42. Fan structure 50 is mounted on plate 52 by bolts 51 and is spaced from the upper surface of plate 31 by rods 54. These rods are threaded into apertures 56 in plate 31. Plate 52 is secured to the rods by bolts 58. The mounting of the amplifying device modules on plate 31 permits an efficient and economical heat transfer structure for the amplifier while permitting easy insertion and removal of individual modules.

A signal to be amplified is applied to input coaxial connection device 12 in FIG. 2 which is affixed to the central port of divider cavity plate 31 by bolts 16. Coaxial connection device 14, attached to the central port of plate 21 of combiner cavity 20 by bolts 18, is adapted to transfer the combined amplified signals to a load.

Figure 4:
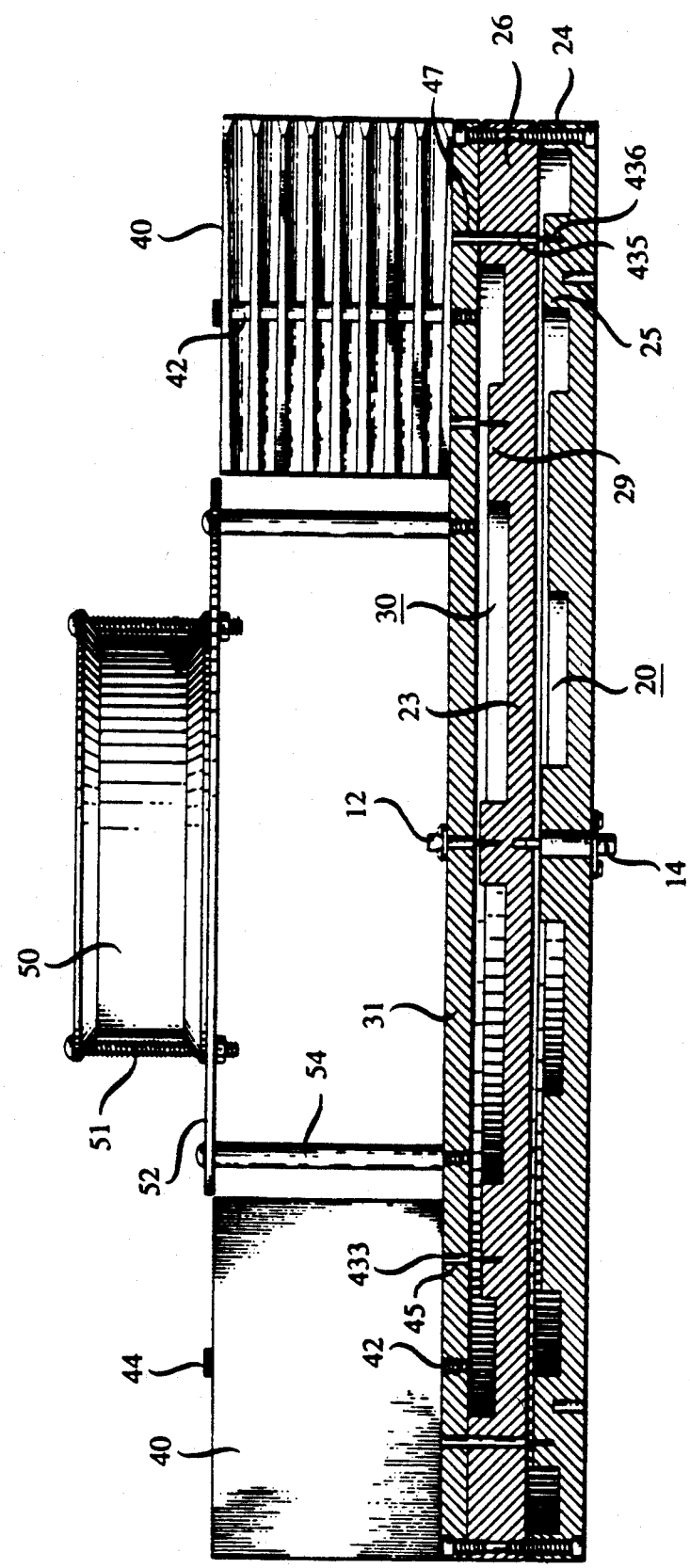
FIG. 4 is an elevation view of the apparatus of FIG. 1 through section 4—4 showing the interconnections between the power divider cavity, the amplifying device module and the power combiner cavity.

FIG. 4 depicts a cross section of amplifier structure 10 including amplifying device modules 40, divider cavity 30 and combiner cavity 20 along lines 4—4 in FIG. 1. Referring to FIG. 4, input signal energy enters the central port of divider cavity 30 through connection 12 in plate 31 and flows radially outward. Each amplifying device 40 has a coaxial input coupler 433 extending into divider cavity 30 through aperture 45. The outer conductor of coaxial input coupler 433 is in slidable contact with aperture 45 in plate 31 but does not extend into cavity 30. The center conductor of coupler 433 extends through cavity 30 and is in contact with the upper side of plate 23.

Amplifying device 40 may comprise a semiconductor circuit such as described in "Microwave Transistor Amplifiers Design and Analysis" by Guillermo Gonzalez, Prentice Hall, Inc., Englewood Cliffs, N.J. 1984. The output signal of amplifying device 40 appears on coaxial output coupler 435. The outer conductor of coupler 435 extends through aperture 47 and through a passageway in outer wall 26 of cavity 30 and plate 23 aligned therewith so that center conductor 436 of output coupler 435 passes through cavity 20 and contacts ridge 25. Combiner cavity 20 receives the output signal energy of each amplifying device 40 at ridge 25. The signal energy received by the combiner cavity from amplifying devices 40 flows radially inward toward coaxial connection device 14 which may be connected to a load such as an antenna via a cable not shown.

Figure 3:
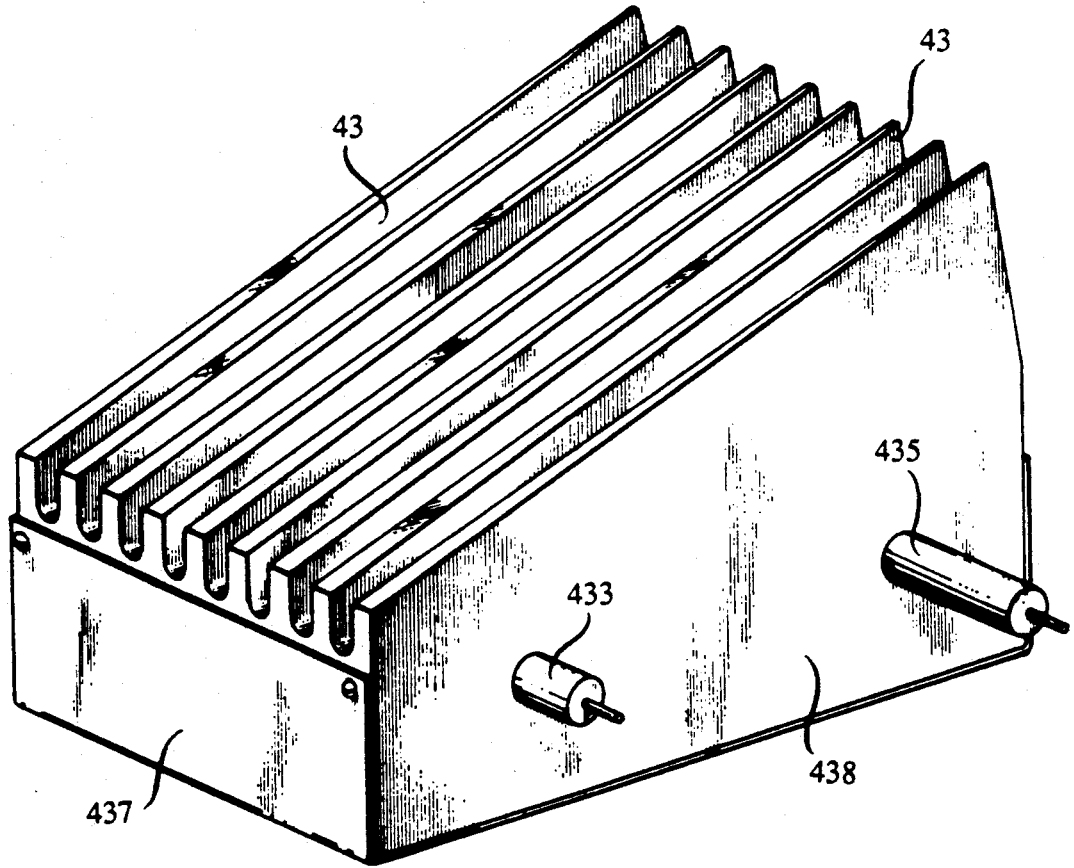
FIG. 3 is a perspective view of the housing of an amplifying device module of FIG. 1.

The wedge shaped housing structure of amplifying device module 40 is shown in greater detail in FIG. 3. Referring to FIG. 3, the electronic components comprising the amplifying device are contained in the interior of the housing within the width of side 437 while fins 43 extend from one side of the housing. Side 438 of the housing which is adapted to be placed on plate 31 as shown in FIG. 2 includes mounting arrangements for input coaxial extension 433 and output coaxial extension 435. Coaxial extension 433 is connected to the input of the amplifying device and coaxial extension 435 is connected to the output of the amplifying device. Coaxial couplers 433 and 435 both extend from one side of the housing and are spaced to fit into the corresponding set of apertures 45 and 47, respectively, along a radial line in FIG. 1. In FIG. 4 the closure structure for divider cavity 30 has the same outside diameter as the closure structure for combiner cavity 20 but its outer peripheral closure wall 26 is thicker than the peripheral closure wall beneath it for the combiner cavity 20. Input coupler 433 is relatively short so that it is slidably insertable into divider cavity 30 via an aperture 45, and output coupler 435 is relatively long so that it extends through the passageway including the corresponding aperture 47 in plate 31, outer cylindrical wall 26 of cavity 30 and plate 23 into cavity 20.

Coupler 433 is located closer to the narrow edge of side 438 (FIG. 3) and is inserted into an aperture 45 in the outer portion of divider cavity 30 while coupler 435 is located nearer the wider edge of side 438 so that it is inserted into aperture 47 and through the outer cylindrical wall of cavity 30 into the outer portion of combiner cavity 20. As aforementioned, the positions of couplers 433 and 435 may be reversed where more convenient. The center conductor of input coupler 433 extends through divider cavity 30 to receive signal energy therefrom while the outer conductor of input coupler 433 slides into aperture 45 but does not protrude into the divider cavity. The outer conductor of output coupler 435 extends through the cylindrical wall of plate 31 of divider cavity 30 into cylindrical wall 26 of plate 23 but does not extend into cavity 20. The center conductor of coupler 435 passes through cavity 20 at ridge 25 to provide efficient signal coupling into the combiner cavity. It is to be understood that other arrangements for entering combiner cavity 20 may be used which will be later described in more detail.

The structures of coaxial connector units 433 and 435 and the particular details of such structures may be as disclosed in U.S. Pat. No. 4,967,168 issued Oct. 30, 1990 in the name of E. V. Bacher and R. E. Myer for "Coaxial Wave Guide Coupling Assemblages", such patent being assigned to the assignee hereof and being incorporated herein by reference and made a part hereof.

Amplifying device 40 is mounted on plate 31 of divider cavity 30 by holding device 40 in a raised position over that plate and aligning the input and output couplers along the radial line through the pair of apertures 45 and 47 therealong. Input coupler 433 is placed above aperture 45 and output coupler 435 is placed above aperture 47. A guide rod 42 has previously been threaded into plate 31 to stand upright therefrom, and device 40 in its raised position is disposed above that rod. The amplifying device is slid from such raised position down on rod 42 such that the rod passes relatively upwards through receptacle holes therefor in the amplifier fins 43. The device 40 is then secured by tightening nut 44 onto the threaded top section of the rod 42. Amplifying device removal is accomplished by reversing these steps.

Figure 5:
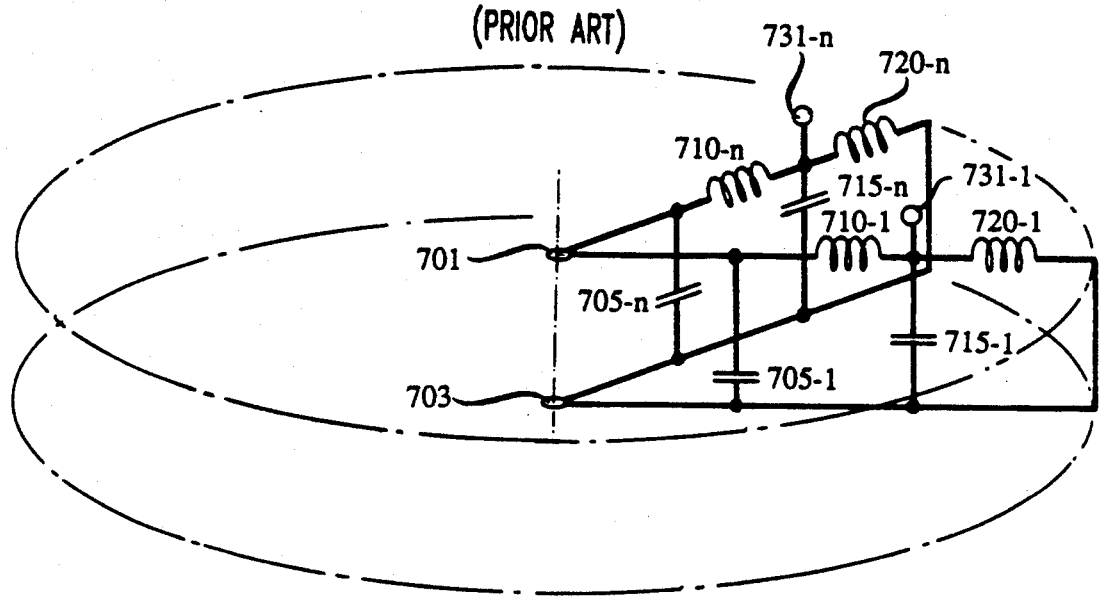
FIG. 5 is a circuit diagram showing an electrical equivalent circuit illustrating the effect of the divider cavity of FIG. 1.

FIG. 5 shows an electrical equivalent circuit for divider cavity 30 in which the narrow sections in the cavity above the ridges in plate 23 are represented as capacitor elements and the wide sections intermediate the ridges are represented as inductive elements. As illustrated in FIG. 5, the input signal is applied to points 701 and 703 which correspond to the center of the cavity through input connection 12 (FIG. 2). The signal energy spreads as it travels radially outward so that a portion of the energy is available to each amplifying device input coupler. An input coaxial coupler is connected to point 731-1 for one amplifying device. Another input coaxial coupler is connected to point 731-n and couplers are connected to points 731-2 through 731-n-1 for amplifying devices therebetween with networks not shown. For n amplifying devices each with an input impedance of 50 ohms, the resulting impedance of the n units connected in parallel is 50/n ohms. The ridge arrangement of cavity 30 between the lower portion of plate 31 and the upper portion of plate 23 provides an impedance network well known in the art so that a load impedance of 50 ohms is presented between points 701 and 703 to connection 12 and a source impedance of 50 ohms is presented to each amplifying device at its input point 731-n in the frequency range of interest.

The equivalent circuit for one amplifying device, in cavity 30 shown in FIG. 5, comprises capacitors 705-1 and 715-1 corresponding to ridges 33 and 29 in FIGS. 2 and 4 and inductances 710-1 and 720-1 corresponding to the valley portions between these ridges.

Figure 6:
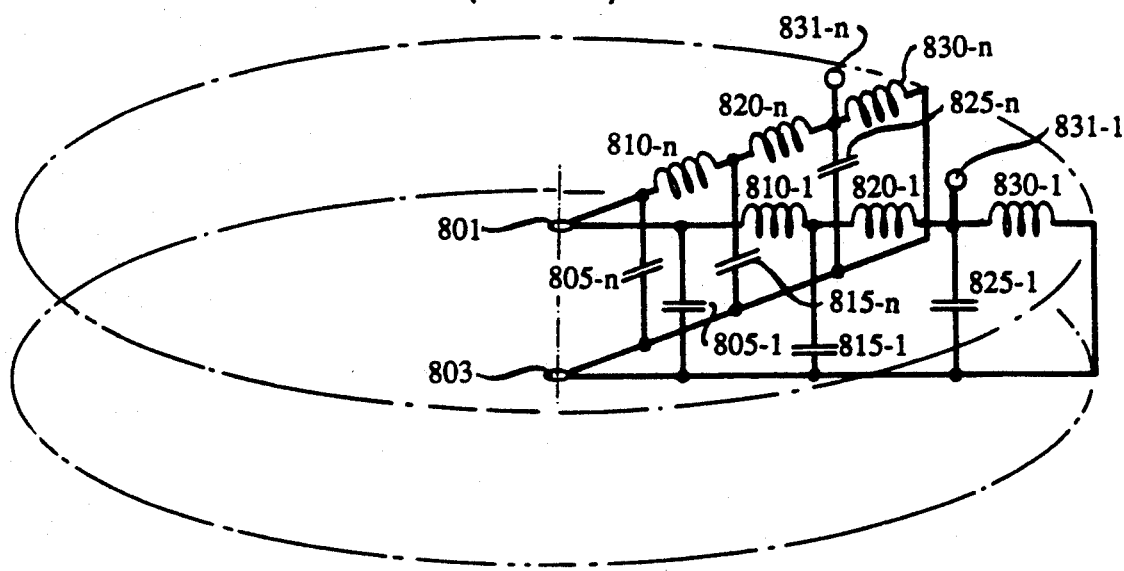
FIG. 6 is a circuit diagram showing an electrical equivalent circuit illustrating the effect of the combiner cavity of FIG. 1.

FIG. 6 shows an electrical equivalent circuit for combiner cavity 20 which combines the amplified signal energy from the amplying device output couplers. The output of amplifying devices 40 are applied to points 831-1 through 831-n, respectively. These points correspond to apertures 47 on the outer portion of the stacked cavities. An output coupler is connected to point 831-1. Another output coupler is connected to point 831-n and couplers are connected to similar points for amplifying devices therebetween with networks not shown. For n amplifying devices each with an output impedance of 50 ohms, the resulting impedance of the amplifying device outputs connected in parallel absent the combiner cavity is 50/n ohms. The ridge arrangement between the lower portion of plate 23 and the upper portion of plate 21 provides an impedance matching network so that a source impedance of 50 ohms is presented between points 801 and 803 to output connection 14 and a load impedance of 50 ohms is presented to each amplifying device at its input point 831-n. The equivalent circuit for one amplifying device, in cavity 20 shown in FIG. 8, comprises capacitors 805-1, 815-1 and 825-1 corresponding to portions of ridges 28, 27, and 25 and inductances 810-1, 820-1 and 830-1 corresponding to the valleys between these ridges. For another amplifying device, capacitors 805-n, 815-n, and 825-n and inductors 810-n, 820-n and 830-n are formed from the associated portions of the ridges and valleys therebetween.

The number of amplifying devices inserted into the divider and combiner cavities may vary from one to the number required to fill the outer portion of plate 31. The parameters of the divider and combiner cavities, however, are fixed for a prescribed number of amplifying devices. In the event that fewer devices are inserted, there is an impedance mismatch at the input and output ports of the radial cavities. While the mismatch at the input port of divider cavity causes little variation in the amplifier gain over the desired frequency range, the mismatch at the output port is significant. An impedance matching stub well known in the art at the output port such as ¼ wave stub 17 in FIG. 4 may be used to compensate for such output port mismatch. The parameters of the stub are a function of the number of amplifying devices used. For example, if half of the amplifying devices are plugged into the divider and combiner cavities, a matching stub of 70.7Ω is required.

Figure 7:
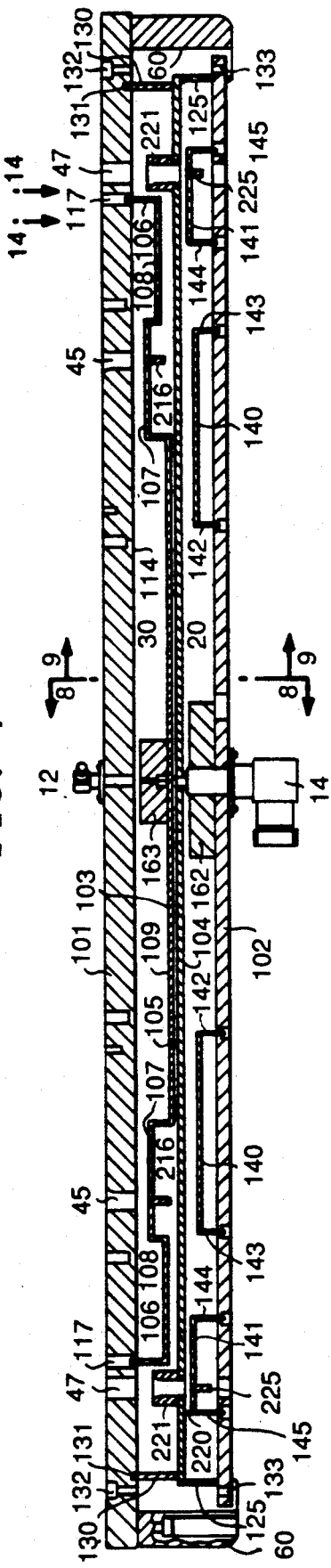
FIG. 7 is a front elevation in cross-section of the cavity closure structure of apparatus which is an embodiment of the invention hereof.
Figure 8:
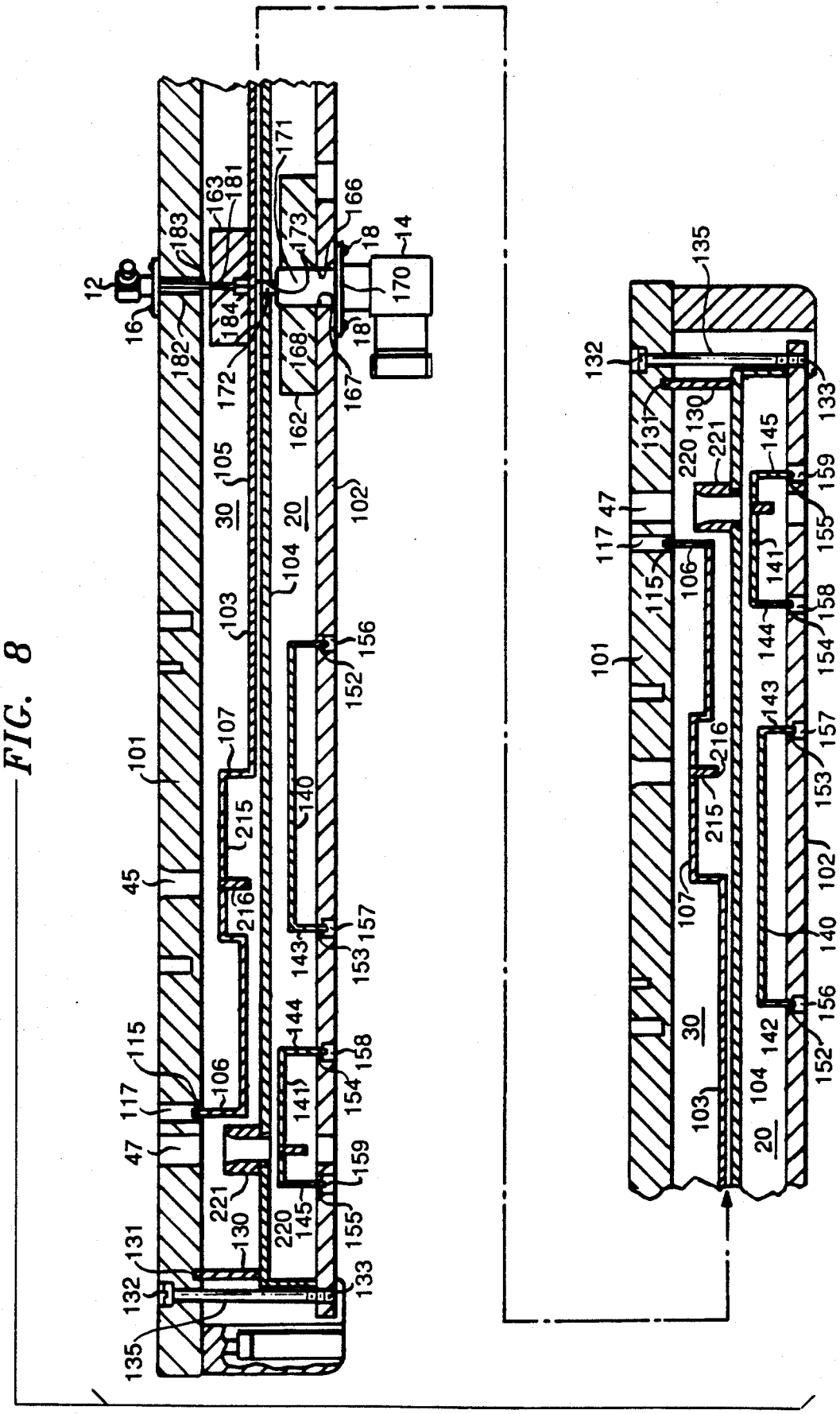
FIG. 8 is an enlarged front elevation view in cross-section of a part of the FIG. 7 embodiment.

FIGS. 7 and 8 show the cavity closure means and associated details of splitter-combiner microwave amplifying apparatus according to the present invention. Referring to these figures, such closure means comprises a top wall means on the upper side of divider cavity 30 and in the form of a relatively thick rigid horizontal metallic plate 101 of constant thickness and having a flat undersurface bounding that cavity. Plate 101 is constituted of aluminum. A bottom wall means for the mentioned closure means is provided by a horizontal aluminum plate 102 with similar characteristics to plate 101. The upper and lower cavities 30 and 20 are separated by central wall means in the form of upper and lower relatively thin and somewhat flexible annular horizontal dishes 103, 104 vertically spaced from each other by a small gap 105 and constituted of aluminum sheet metal. Dishes 103 and 104 bound the lower and upper sides of, respectively, the upper divider or splitter cavity 30 and the lower combiner cavity 20.

The sheet metal of dish 103 is inflected at the circumferential margin of the dish to form therefor a circular peripheral flange 106 upstanding from the relatively flat central panel portion of the dish and substantially at a right angle to that panel portion. Radially inwards of flange 106, the sheet metal of dish 103 is inflected to form an alternation, facing toward upper cavity 30, of an annular ridge 107 and radially outer and inner valleys 108 and 109 on radially opposite sides of the ridge 107.

The dish 103 is coupled to the plate 101 in a manner as follows. Plate 101 has formed in its underside an angularly continuous annular groove 115 (FIGS. 14 and 15) coaxial with the axes of cavities 30 and 20 and extending from the bottom surface 114 of plate 101 vertically upward for a short distance to terminate at a top 116 for the groove. Distributed equiangularly along the center line of groove 115 are a set of twenty circular access holes 117 (FIGS. 14 and 15) extending from the top surface of plate down into the plate to intersect with groove 115 and to terminate at bottoms 118 which provide blind ends for such holes, and which bottoms are vertically located below the groove top 116. The holes 117 are of greater diameter than the radial width of groove 115 so that such holes extend to either radial side of the groove.

Figure 15:
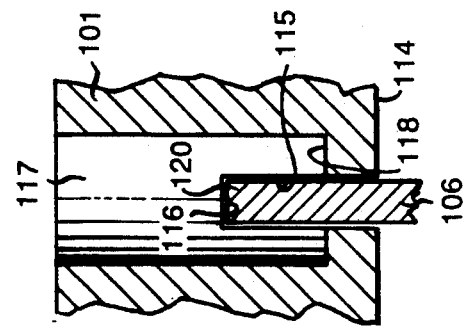
FIG. 15 is a fragmentary elevational view in cross-section, taken as indicated by the arrows 15—15 in FIG. 14 of details shown in FIG. 14.
Figure 14:
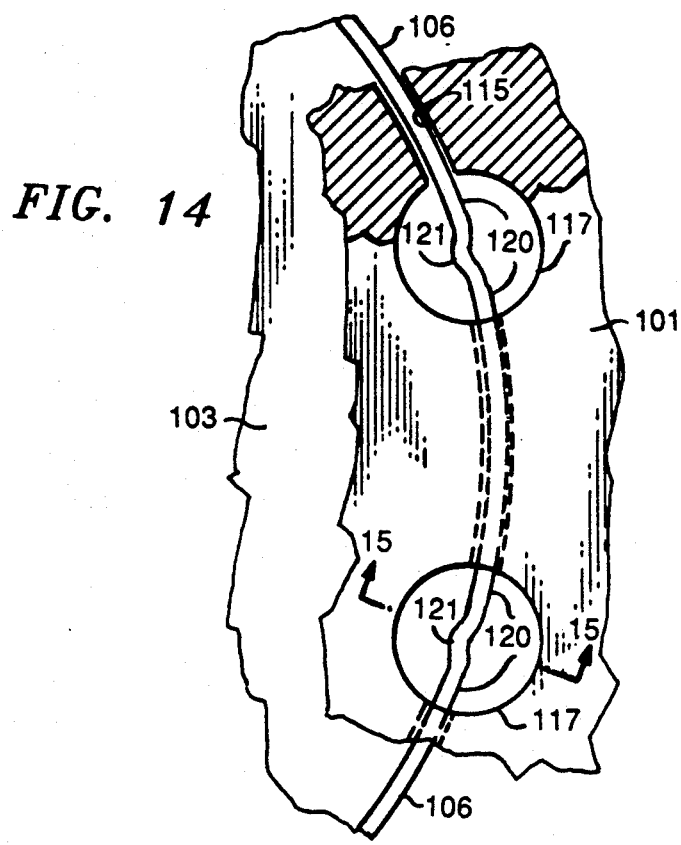
FIG. 14 is an enlarged broken away plan view, taken as indicated by the arrows 14—14 in FIG. 7, of the top plate of the FIG. 7 embodiment and related details.

The groove 115 has seated therein the rim 120 of the peripheral flange 106 of the aluminum dish 103. To fasten that dish to plate 101, the plate is rested on the dish so that the rim 120 of the dish's flange 106 contacts the top 116 of groove 115 all around that groove. There is then inserted into each of holes 117 in turn a bending tool (not shown) having a downward facing slot in its lower end. The tool is positioned in that hole so that the portion of flange rim 120 in such hole is received with such slot. The tool is next forcibly turned within the hole to twist the rim portion in the tool slot so as to bend such portion into an angulation 121 located above the bottom 118 of the hole. FIG. 15 shows the flange rim 120 in a hole 117 before such an angulation is formed in the rim. FIG. 14 in contrast shows such rim after angulations have been formed in it. These angulations serve to anchor dish 103 firmly to plate 101.

The aluminum material of the flange rim 120 is sufficiently ductile that its bending, as described, in holes 117 does not break the rim. The milling of plate 101 required to form groove 115 is minimal. The twisting as described in holes 117 of the flange rim creates stresses in flange 106 producing a forcible drawing together of the plate 101 and dish 103. That forcible drawing together causes, first, a durable fixing of the relative horizontal positioning of the plate and dish and, secondly, good electromechanical contact therebetween all around the flange to thereby avoid or reduce the creation of electrical discontinuities at the metallic wall surfaces bounding cavity 20. Moreover the described mode of coupling of the plate and dish conserves the radial space needed to be occupied by the dish in that it does not require any radially extending horizontal flange in order to fasten the dish to the plate by bolts passing through such flange.

Turning now to the lower circular sheet metal dish 104, the sheet metal thereof is inflected at the circumference of the dish to form a circular peripheral flange 125 downstanding from the flat central panel of the dish. The lower rim of flange 125 merely rests on the upper surface of the lower plate 102 to be slidable on that flat horizontal surface. That is, at a stage in the fabrication of the cavity closure assembly shown in FIG. 7, the dish 104 and plate 102 are freely adjustable in their relative horizontal positioning.

Disposed vertically between dish 104 and plate 101 is an annular spacer collar 130 having its upper end seated in an annular groove 131 formed in the underside of plate 102. The lower end of collar 130 rests on the flat horizontal top of dish 104 to be slidable thereon. The spacer collar 130 may conveniently be provided by a band of aluminum bent into a circle to form a split ring.

Radially outward of groove 131, the upper plate 101 is pierced by a set of equiangularly distributed vertical unthreaded holes 132 vertically registering with a corresponding set of unthreaded vertical holes 133 formed the lower plate 102 to form pairs of aligned holes 132, 133. Each such pair of holes is adapted to receive one of a set of clamping bolts 135 (FIGS. 8 and 9) passing through the top hole of the pair and into its bottom hole to threadedly engage the plate 102. By proper turning of the bolts 135, the plates 101 are drawn together to cause spacer collar 130 to transmit force downward to dish 104 to press the flange 125 of that dish hard against the top of plate 102 to thereby clamp the dish and plate together in their relative horizontal positioning existing at the time. Concurrently, the drawing together of plates 101, 102 by bolts 135 and the action of collar 130 on dish 104 serves to fix the size of the gap 105 between the dishes 103, 104 as a function of the vertical dimension of that ring. That gap size is not critical so long as it is great enough to permit tuning through an appropriate range of the cavities 30 and 20 as later described.

The lower plate 102 is shown in FIG. 7 as bearing on its upper side a plurality of concentric annular sheet metal rings 140 and 141. The sheet metal of ring 140 is bent at each of its radially opposite margins to form circular peripheral flanges 142, 143 downstanding from the central panel of that ring. Similarly, the sheet metal of ring 141 is bent to form circular peripheral flanges 144, 145 downstanding from the central panel of the latter ring.

The peripheral flanges 142, 143, 144, 145 of the rings 140, 141 are seated in respectively corresponding annular grooves 152, 153, 154, 155 extending for a short distance down into plate 102 from its upper side. The grooves 152, 153, 154, 155 have equiangularly distributed therearound, along their centerlines, respective sets of vertical access holes 156, 157, 158, 159. Each of those holes extends from the undersurface of plate 102 vertically upward to intersect with the associated groove, and to terminate in a blind end disposed upwards of the bottom of such downwardly extending groove. In general, the arrangements of grooves and access holes provided by the elements 152-155, 156-159 for affixing the sheet metal flanges 142-145 to plate 102 is the same as the arrangement described above of groove 115 and tool access holes 117 for affixing the sheet metal flange 106 to plate 101. A difference is that such arrangements for affixing the flanges 142-145 are "upside down" in relation to the arrangement for affixing the flange 106. Taking that difference into account, however, the foregoing description of how flange 106 is fastened to plate 101 by using a tool inserted into the access holes to form angulations in the rim portions in such holes of the flange is a description which is equally applicable to the technique by which flanges 142-145 are affixed to plate 102 by using a bending tool to form angulations in the holes 156-159 of the rim portions therein of the flanges therein. By virtue of the use of such technique, the sheet metal rings 140, 141 forcibly drawn together with plate 102 to be firmly fixed in their positioning relative thereto and to make good electromechanical contact therewith all around the flanges 142-145. A result of such good contact is that there is avoided or reduced the creation of electrical discontinuities in the metallic wall surfaces bounding the lower combiner cavity 20. From what has been said, it will be evident that the rings 140, 141 form on plate 102 a plurality of annular hollow bosses projecting into cavity 20. Such plate and rings together serve to bound cavity 20 on its lower side by a metallic composite wall surface comprising surface portions of both said plate and said rings and having therein an alternation of ridges and valleys concentric with each other and facing toward that cavity.

Figure 9:
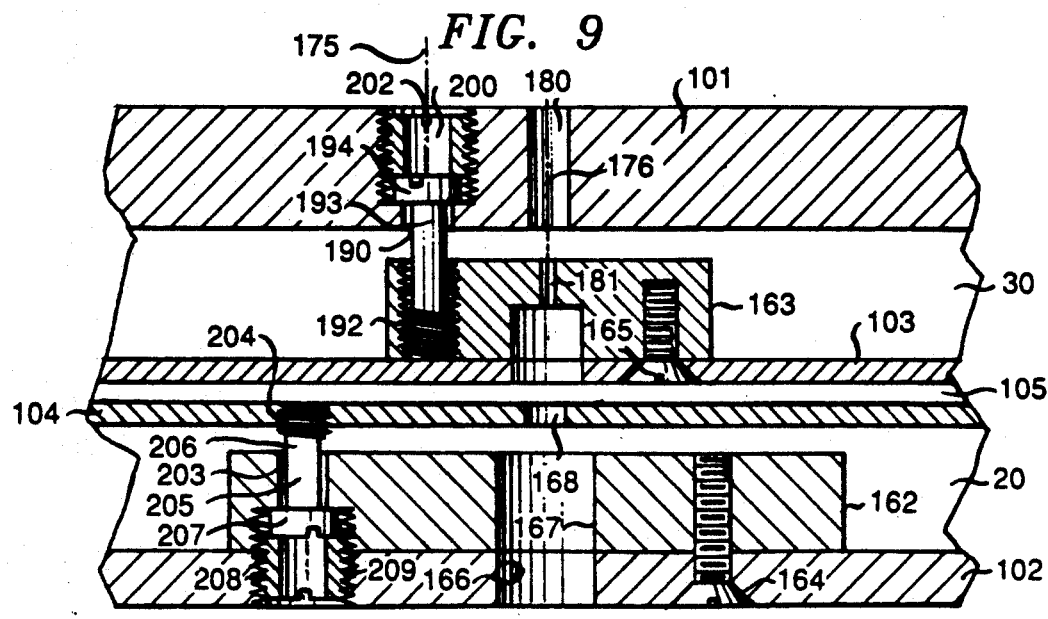
FIG. 9 is a fragmentary enlarged right side elevation in cross-section of the central portion of the FIG. 7 embodiment, the view of FIG. 9 being at a right angle, to the FIG. 7 view.

Referring now to FIG. 9 as well as FIGS. 7 and 8, the plate 102 and dish 103 on their upper sides have thereon respective relatively thick solid aluminum circular disks 162, 163 disposed radially at the respective centers of such plate and dish and fastened thereto by respective sets of bolts 164, 154 equiangularly distributed around the axes of the disk 162 and the disk 163. Disk 162 forms on plate 102 a central circular boss coaxial with the bosses formed thereon by sheet metal rings 140, 141 (FIG. 7) so as to add another "ridge" to the alternation of ridges and valleys characterizing the composite wall surface for cavity 20 provided by such rings and underlying plate 102. Similarly disc 163 is coaxial with the annular ridge 107 formed in the plate 103 by bending of its sheet metal so as to add another "ridge" to the alternation pattern of ridges and valleys for the metallic wall surface bounding the lower side of cavity 30.

Plate 102 has formed therein (FIG. 9) a vertical bore 166 coaxial with a similar diameter bore 167 formed in plate 162 and another vertical bore 168 of much smaller diameter formed in dish 104 across the cavity 20 from disc 162. The bores 166, 167, 168 have received therein different parts of the coaxial connection device 14 fastened to the cavity closure structure by bolts 18 (FIG. 8). Device 14 may be a coaxial connector of the type which is described in U.S. patent application Ser. No. 07/473,770, now U.S. Pat. No. 5,001,443, entitled "Coaxial Wave Guide Assemblages", filed Feb. 2, 1990 in the name of James N. Martin, and assigned to the assignee hereof, such application being incorporated herein by reference and made a part hereof. Device 14 comprises (FIG. 8) a metal base 170 fastened to plate 102 by bolts 18, a dielectric sleeve 171 projecting from such base into and through bores 166, 167 and a pin 172 serving as a coaxial inner conductor and passing coaxially upward through sleeve 171 and beyond it to a tapered tip 173 partly received in bore 168. As described in the patent application just mentioned, pin 172 below tip 173 is of somewhat greater diameter than bore 168, and the tip 173 is resiliently radially compressible.

Turning to the upper plate, 101 (FIG. 9), that plate has formed in it a vertical bore 180 coaxial with a vertical axis 175 for the cavity 30 and with a smaller vertical bore 181 formed in disc 163 coaxial with its axis and extending downward from its upper surface. Bores 180 and 181 serve as receptacles for different parts of the input coaxial connector device 12 (FIG. 8) fastened to plate 101 by bolts 16 and similar in structure to the device 14 described above. The inner conductor pin 182 of device 14 is of somewhat greater diameter than bore 181 and terminates in a radially resiliently compressible tapered tip 183 partly received in that bore and resiliently compressed by being introduced thereinto so as to make electromechanical contact under pressure with the disc 163. Bore 181 at its lower end is enlarged by a countersink 184 extending into disc 163 from its underside, and into which the upper end of the inner conductor tip 173 of coupler 14 may be received with a clearance all around permitting relative horizontal adjustment between dishes 103 and 104.

Figure 10:
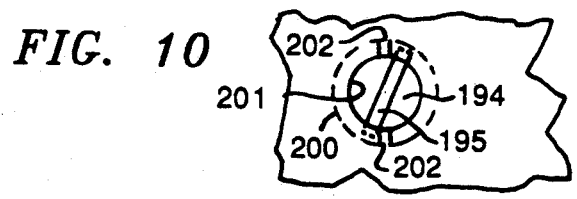
FIG. 10 is a fragmentary plan view of details shown in FIG. 9.

As best shown by FIGS. 9 and 10, the upper plate 101 is pierced by an unthreaded vertical hole 190, topped by a larger diameter threaded countersink 191 unthreaded hole 190 registers with a threaded vertical hole 192 in disc 163. An insulative cavity tuning screw 193 is inserted into holes 190 and 192 and, at its forward end, has threads engaging with the threads on the wall of hole 192 to produce a threaded coupling of the screw to disc 163 and, hence, to sheet metal dish 103. Screw 193 is made of a material having good dimensional stability with temperature change as, for example, without being limited to, the material G-10 expoxy glass. The screw 193 has an axis 176 which is aligned in FIG. 9 with the cavity axis 175 and, also, has a head 194 which contains a slot 195. Head 194 is seated on the bottom of countersink 191 and is of greater diameter than that of hole 190 so that the head cannot be forced down into that hole.

Received in threaded countersink 191 above screw head 194 is an annular plug 20 having a central cylindrical aperture 201 passing vertically therethrough, and having a threaded cylindrical external wall of which the threads engage these on the countersink to permit, by turning of the plug, on axial motion of the plug in either direction in countersink 191. To aid in that turning, the plug 200 has a slot 202 formed in its top.

The elements 190-195, 200-202 constitute an arrangement for tuning the resonant frequency of divider cavity 30, as well be later described in more detail. The lower cavity 20 is adapted to be tuned by similar means comprising an insulative cavity tuning screw 205 having a threaded stem 206 passing upward through an unthreaded hole 203 in disc 162 into a threaded hole 204 in sheet metal dish to threadedly engage with that dish. Screw 205 has a head 207 seated in the bottom of a "countersink" bore 208 passing upward through plate 102 and disc 162 and having a threaded wall over its portions in the disc. Below screw head 207, the bore 208 contains an annular plug 209 threadedly engaging the wall of bore 208 in disc 162. In order to turn the screw 205 and the plug 209, the screw head 207 and the bottom of the plug have slots therein similar to the slots 195 and 202 in (FIG. 10) the screw head 194 and the plug 200.

Figure 11:
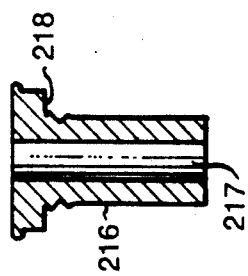
FIG. 11 is an elevational view in cross-section of one of the small bushings used in the FIG. 7 embodiment.
Figure 12:
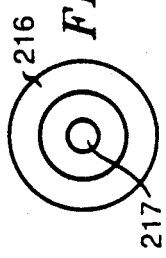
FIG. 12 is a bottom view of the FIG. 11 bushing.

Returning to FIGS. 7 and 8, the upper plate 101 is pierced by a set of relatively large diameter vertical bores 45 registering and coaxial with a set of corresponding holes 215 on the opposite side of cavity 30 and passing vertically through the ridge 107 of sheet metal dish 103. Press fitted into holes 215 to be affixed with dish 103 are a set of small hollow cylindrical bushings 216 having (FIGS. 11 and 12) vertical central passages 217 therethrough and heads 218 fittable into holes 215. The bushings 216 project from plate 103 away from cavity 30 instead of toward it so as to avoid the creation in such cavity of impedance anomalies caused by the presence of such bushings. The bushings 216 are, however, recessed in the hollow formed underneath ridge 107 so as to not extend into the gap 105 between dishes 103 and 104.

Each hole 45 in plate 101 is paired with a "small" bushing 216 on dish 103 to provide for each of the input coaxial connector units 433 for amplifiers 40 (FIG. 4) a pair of receptacles for containing therein different parts of that connector unit. More specifically, units 433 may, as earlier stated, be of the kind disclosed in U.S. Pat. No. 4,967,168 so as to comprise metallic coaxial inner and outer conductors, separated by dielectric material where axially coextensive, the inner conductor comprising a pin projecting forward of the outer conductor and terminating in a resiliently radially compressible tip. Each such unit is received in one of holes 45 and the paired bushing 216 so that the unit's outer conductor is in electromechanical contact with the wall of that hole 45. The inner pin conductor of such unit is of greater diameter above its tapered tip than the passage 217 in such bushing, and such tapered tip is only partly received in such passage and is resiliently compressed by entry into it so as to make electromechanical contact under pressure with the wall of such passage to thus be electrically coupled with dish 103.

Figure 13:
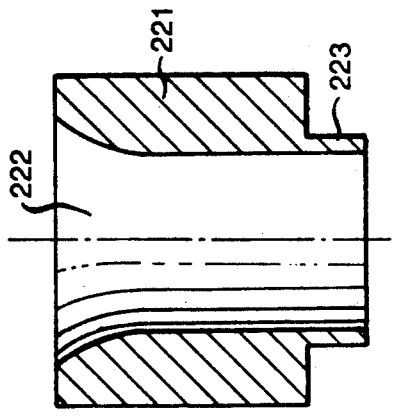
FIG. 13 is an elevational view in cross section of one of the large bushings used in the FIG. 7 embodiment.

The FIG. 7 embodiment further includes the holes 47 in plate 101 and a set of holes 220 disposed beneath holes 47 and shown in FIGS. 7-9 as formed in lower sheet metal dish 104. Press fitted into holes 220 are a set of "large" bushings 221 having (FIG. 13) vertical central passages 222 therethrough and bases 223 deformably fittable into holes 220. Bushings 221 project from dish 104 away from the cavity 20 bounded by that dish, and the "large" bushings 221 are paired with, and vertically register with, respectively corresponding "small" bushings 225 press fitted into holes in the sheet metal ring 141 on lower plate 102 to project from that ring in the direction away from the cavity 20 bounded by ring 141. Bushings 225 are similar to the "small" bushings 216 already described. Each hole 47, large bushing 221 underneath and its corresponding small bushing 225 provide respective receptacles for different parts of one of the output coaxial connector units 435 which (FIG. 4) extend from amplifiers 40 to the lower cavity 20, and which units 435 are longer than input units 433 described above but are otherwise similar in structure to the latter units. Each such unit 435 is received within a hole 47 and a paired large bushing 221 and associated small bushing 225 so that the outer coaxial conductor of the unit electromechanically contacts the walls of such hole and large bushing, and so that the resiliently radially compressible tip of the inner coaxial conductor pin is partly received in the passage in the small bushing and is compressed therein to make pressure electromechanical contact with bushing 225.

Use and Features of FIG. 7 Apparatus

The embodiment of the invention constituting the described splitter-combiner apparatus incorporating the FIG. 7 cavity closure means is fabricated as follows. As described above sheet metal rings 140 and 141 are fastened to lower plate 102, sheet metal dish 103 is fastened to upper plate 101, and band 130 is inserted into groove 131 in that upper plate to form the spacer collar. Sheet metal dish 104 is then placed on plate 102 so that the flange 106 of the dish rests on the top surface of that plate. Next, the assembly of elements 101, 103 and 130 is placed over dish 104 so that such dish is contacted by the lower end of spacer collar 130. Plates 101, 102 and dish 104 are then adjusted in relative horizontal positioning so that the holes 47 in plate 101, the vertical passages 222 in large bushings 221 and the vertical passages in small bushings 225 are roughly in vertical alignment with each other. When such rough alignment has been achieved, precision dummy aligning pins (not shown) are passed through selected of the holes 47 and the passages in the large bushings 221 and small bushings 225 beneath those selected holes to produce a desired accurate relative horizontal positioning between the elements 101, 102 and 104. Such elements are then clamped in that accurate positioning by tightening bolts 133 to draw together plates 101 and 102.

An advantage in achieving fixed relative horizontal positioning as described between dish 104 and plates 101 and 102 is that accurate alignment of the large bushings 221 relative to the holes 47 and bushings 225 may be obtained merely by relatively accurately locating in dish 104 the bushing holes 220 without requiring as well that such holes also be accurately located relative to datum points on dish 104 which reference the location of that dish as a whole to datum points on plate 101 and/or plate 102.

With such clamping being completed, the amplifiers 40 are lowered one by one onto top plate 101 to pass the input coaxial couplers 433, through holes 45 and partly into bushings 206 and, concurrently, to pass the output coaxial couplers 435, through holes 47 and bushings 221 partly into bushings 225. When this is done various parts of the couplers 433 and 435 became electrically coupled by electromechanical contact with various parts of the cavity closure means as described above, and the assembling of the described splitter-combiner apparatus has been completed.

When such apparatus is operating, the cavity 30 is tuned to a desired resonant frequency by using a screwdriver or other tool to back off plug 200 in countersink 191 just enough (FIGS. 9 and 10) to permit turning of screw 193 while concurrently retaining that screw substantially fixed in axial position relative to plate 101. Screw 193 is then turned by a screwdriver inserted into the central aperture of plug 200. The turning of screw 193 operates through the threaded engagement of the screw with disc 163 to positively displace the radially central panel of flexible dish 103 either towards or away from plate 101 (across cavity 30 from dish 103), in dependence on the direction of angular turning of screw 193, so as, thereby, to vary the resonant frequency of cavity 30 until it corresponds to a desired frequency value. Once cavity 30 has been so tuned, plug 200 is tightened down on screw 193 to fix its angular position to thereby keep the cavity resonant at that desired frequency.

The ability to positively displace the central part of dish 103 in either axial direction by moving screw 193 in one or the other of its two angular directions of turning is advantageous because it avoids the necessity of having in gap 105 a compression spring, or the like, operating upon retraction of the screw to displace the dish in the axial direction toward plate 101, the screw itself acting to displace the dish in the other axial direction. Because, however, gap 105 need not be designed to contain such a spring or the like, the vertical dimension of the gap may be reduced to no more than that necessary to enable tuning over the frequency ranges desired of the resonant frequencies of cavities 30 and 20 to thereby make more compact in the vertical dimension the described splitter-combiner apparatus.

The use of screw 193 or like means adapted to positively displace the center part of flexible dish 103 in either axial direction is also advantageous because the screw, when stopped at its desired setting, locks such center part against further displacement in either axial direction to thereby contribute to the dimensional stability of the configuration of the dish.

Plug 209 and insulative screw 205 may be used to tune the resonant frequency of cavity 20 entirely independently of the tuning of cavity 30. The manner in which such plug and screw are manipulated to effect such tuning of cavity 20 will be self evident from the description just given of the manner of tuning cavity 30 by screw 193 and plug 200.

In the splitter-combiner apparatus having the cavity closure means shown by FIG. 7, the inner coaxial conductors of the output coaxial couplers 435 435 435 435 inserted into holes 47 need only be long enough to reach the bushings 225 disposed on the top of the composite wall means provided by plate 102 and sheet metal rings 140, 141. That is, such inner coaxial conductors need not be large enough to reach the plate 102 itself. Accordingly the composite structure of plate 102 and rings 140, 141 affords the advantage of being able to use shorter output couplers than are needed for, say, the FIG. 6 embodiment of the mentioned Myers 18 application while, at the same time avoiding most of the milling expense incident to the extensively milled plates of the cavity closure means disclosed in the '400 patent.

The use of bushings press fitted into holes in the sheet metal dishes 103, 104 and the sheet metal rings 140, 141 improves the reliability of the electrical coupling between the coaxial coupler units 433, 435 and the sheet metal elements with which such coupling is made. None of such bushings project into either of cavities 20 and 30 so as to possibly create impedance anomalies in such cavities. Moreover, none of such bushings project into the gap 105 between sheet metal dishes 103, 104 so as to necessitate an undesired increase in the vertical size of such gap.

The above described embodiment being exemplary only, it is to be understood that additions thereto, omissions therefrom and modifications thereof can be made without departing from the spirit of the invention. Accordingly, the invention is not to be considered as limited save as is consonant with the recitals of the following claims.

We claim:

1. The improvement in divider-combiner microwave amplifying apparatus comprising: cavity closure means comprising vertically spaced top and bottom wall means and central wall means therebetween, horizontally extending upper and lower cavities vertically interposed between said central wall means and, respectively, said top and bottom wall means so that vertically opposite sides of each of such cavities are bounded by metallic wall portions provided by such top, bottom and central of wall means, said cavities each permitting horizontal propagation therethrough of electromagnetic wave energy radially between a central port for such cavity and points radially outward of and angularly distributed around such port, a plurality of amplifier modules mounted on and distributed around such closure means, and a plurality of coaxial connector units coupling each of said modules at said points to each of said cavities for transfer of an input of said energy from one of said cavities to said modules and from said modules to the other of said cavities to provide therefrom an output of such energy as amplified; and said improvement being that said bottom wall means comprises: a horizontal metallic bottom plate, and radially spaced annular rings on the upper side of such plate, and each ring comprising sheet metal inflected at the radially opposite margins of each ring to provide therefor a pair of flanges downstanding from the top of said ring, said rings forming hollow annular bosses on such plate, and said plate and rings together serving to bound such lower cavity on its lower side by a metallic composite wall surface comprising surface portions of both said plate and rings and having therein an alternation of one or more ridges and one or more valleys concentric with each other and facing toward said cavity.

2. The improvement according to claim 1 in which said plate on its upper side has annular grooves in which are seated said flanges of each said ring, each such groove has beneath it a set of holes distributed around such groove along its centerline and passing upward through such plate to intersect such groove, and to terminate in blind ends disposed above the bottom of such groove so that the lower rim of the ring flange seated in such groove extends below such ends into said holes, said holes for each groove being radially greater in size than such groove to extend outwards thereof on either radial side of such groove, and said rim being angularly bent in the horizontal plane within said holes to connect such ring to such plate by such flange.

3. The improvement according to claim 2 in which apertures are formed in the top of one of said rings, bushings are respectively fitted in said apertures to project downward from said top into the space beneath it, and in which each of said bushings has received therein, and electromechanically contacts, a portion of a respective one of said connector units.

4. The improvement according to claim 1 in which said top wall means comprises a horizontal metallic top plate, said central wall means comprises lower and upper vertically spaced circular sheet metal dishes bounding respectively, the upper and lower sides of, respectively, said lower and upper cavities, said sheet metal dishes each comprises a central panel and a vertically-extending peripheral flange projecting from such panel and formed by inflection of the sheet metal of such dish, and in which such central panel of said lower dish is substantially flat opposite said alternation of ridges and valleys on the lower side of said lower cavity.

5. The improvement according to claim 4 in which said peripheral flange of said lower dish extends down to and contacts the upper surface of said bottom plate to be horizontally slidable thereon, and in which said improvement comprises means for clamping such plate and dish in a preselected relative horizontal positioning thereof.

6. The improvement according to claim 5 in which said clamping means comprises: a spacer collar vertically interposed between said top plate and the top of said lower dish, and a plurality of screws adapted to draw said bottom and top plates together to produce downward force transmitted through said spacer collar to said lower dish to press said flange thereof against said bottom plate.

7. The improvement according to claim 6 in which apertures are formed in the panel of said lower dish, bushings are respectively fitted in said apertures to project from said lower dish upward away from said lower cavity, and in which each of said bushings has received therein, and electromechanically contacts, a portion of a respective one of said connector units.

8. The improvement according to claim 4 in which the vertical peripheral flange of said upper dish extends upwards from the central panel of said dish, the rim of such flange is received in an annular groove formed in the underside of said top plate, and in which said flange is fixedly fastened by such rim to said top plate so as to couple said upper dish thereto.

9. The improvement according to claim 4 in which apertures are formed in the panel of said upper dish, bushings are respectively fitted in said apertures to project down from said upper dish, and in which each of said bushings has received therein, and electromechanically contacts, a portion of a respective one of said connector units.

10. The improvement according to claim 4 in which said bottom wall means and lower dish have formed therein vertically spaced respective coaxial holes at radially central locations in said wall means and dish, a vertical insulative screw has a head end and a threaded stem end received in, respectively, said hole in such bottom wall means and said hole in such dish to threadedly engage with said dish within such hole therein, and said improvement further comprises screw holding means adapted to substantially fix the vertical position of said screw relative to said bottom wall means while concurrently permitting angular turning of such screw so as, by such turning to vary the spacing at such radially central locations between said bottom wall means and dish to thereby tune said lower cavity.

11. The improvement according to claim 10 in which said holding means comprises a threaded countersink formed in the underside of said bottom wall means, said screw having a head disposed in said countersink adjacent to the inner end thereof, and in which said holding means further comprises a threaded annular plug threadly received in said countersink and movable in said countersink by turning of said plug to clamp said screw against turning or to release it for turning while concurrently substantially fixing the vertical position of such screw relative to said wall means, said plug having therein a central aperture permitting vertical passage through such plug of a tool for turning said screw.

12. The improvement according to claim 1 in which said bottom plate has seated thereon a central solid metallic boss, and in which said plate and boss have therein a central passage extending upwardly therethrough and providing said central port for said lower cavity.

13. The improvement in cavity closure means having therein a horizontally extending microwave cavity and a pair of vertically spaced metallic wall means respectively bounding the top and the bottom of the cavity, and said improvement being that said cavity closure means comprises; a horizontal metallic plate having an annular groove formed in a first side of such plate facing said cavity, and a cavity bounding member of circular outer circumference and comprising sheet metal inflected at said circumference to form for such member a peripheral flange which is outstanding from the central part of said member, and which is seated in said groove, said plate having therein a set of holes distributed around such groove along its centerline and passing entirely through said plate in the direction towards said first side thereof to intersect such groove and to terminate in blind inner ends displaced from the inner end of said groove in said direction so that the rim of said flange extends into said holes, said holes for said groove being radially greater in size than such groove to extend outwards thereof on either radial side of such groove, and said rim being angularly bent within said holes to connect such member to said plate by such flange.

14. The improvement in divider-combiner microwave amplifying apparatus comprising: cavity closure means comprising vertically spaced top and bottom wall means and central wall means therebetween, and horizontally extending upper and lower cavities vertically interposed between said central wall means and, respectively, said top and bottom wall means so that vertically opposite sides of each of such cavities are bounded by metallic wall portions provided by said plurality of wall means, with such central means providing two such portions respectively bounding said upper and lower cavities, said cavities each permitting horizontal propagation therethrough of electromagnetic wave energy radially between a central port for such cavity and points radially outward of and angularly distributed around such port, a plurality of amplifier modules mounted on and distributed around such closure means, and a plurality of coaxial connector units coupling each of said modules at said points to each of said cavities for transfer of an input of said energy from one of said cavities to said modules and from said modules to the other of said cavities to provide therefrom an output of such energy as amplified; and said improvement being that at least one of said top, bottom and central wall means comprises a sheet metal member having apertures extending vertically therethrough and disposed at one of said vertically opposite sides of one of said cavities to bound such cavity by a metallic wall surface provided by said member, said improvement further comprising vertically extending bushings fitted into said apertures, and each bushing having received therein, and electromechanically contacting, a portion of one of said connector units.

15. The improvement according to claim 14 which said bushings are disposed on the side of said cavity closure member away from such cavity bounded by said member so that such bushings project out from said member in the direction away from said cavity.

16. The improvement according to claim 15 in which said connector units each comprise outer and inner coaxial electrical conductors, and in which said lower cavity is at least partly bounded on its upper and lower sides by upper and lower sheet metal members having formed therein respective sets of vertically extending apertures forming pairs of vertically registering larger and smaller apertures in, respectively, the upper and lower ones of said members, said improvement further comprising larger and smaller bushings fitted in, respectively, said larger and smaller apertures to project from respectively, said upper and lower members in the direction away from said lower cavity, and in which the larger and smaller bushings fitted in each such pair of apertures has received therein, and electromechanically contacts, the outer and inner conductors, respectively, of a respective one of such connector units.

17. The improvement in divider-combiner microwave amplifying apparatus comprising: cavity closure means comprising vertically spaced top and bottom wall means and central wall means therebetween, and horizontally extending upper and lower cavities vertically interposed between said central wall means and, respectively, said top and bottom wall means so that vertically opposite sides of each of such cavities are bounded by metallic wall portions provided by said plurality of wall means, said improvement being that at least one of said top and bottom wall means comprises a horizontal metallic plate having surface portions bounding a first of the vertically opposite sides of a first of said upper and lower cavities, said central wall means comprises metallic wall providing means bounding such cavity by a metallic wall surface on the second of such sides of such first cavity and comprising flexible sheet metal so that such wall surface is displaceable towards and away from such plate, said metallic wall providing means having a threaded hole formed therein, an insulative adjusting screw extending from said plate across said first cavity into said hole and threadedly engaged in said hole with the threaded interior wall thereof, and means to hold said screw substantially fixed vertically relative to said plate while permitting said screw's turning in either angular direction so as to positively displace by such turning said wall surface in either vertical direction relative to said plate to thereby tune said first cavity.

18. The improvement in microwave cavity closure means comprising first and second vertically spaced horizontal metallic wall means, and a horizontally extending microwave cavity interposed between such two wall means, said improvement being that said first wall means comprises a relatively rigid horizontal metallic plate, that said second wall means comprises a flexible metallic dish coupled at its periphery to said plate and having a central panel vertically spaced from said plate and displaceable towards and away from said plate, and in which said improvement further comprises cavity tuning means maintainable in substantially fixed vertical position relative to said plate and adapted by adjustment thereof while in such fixed position to positively displace said panel of said dish either towards or away from said plate to thereby tune said cavity.

19. The method of tuning a cavity extending radially outward from an axis therefor and adapted to have microwave energy propagated therethrough between a radially central part of such cavity and points in said cavity radially outward of said part, said method comprising, providing for said cavity first and second metallic wall means bounding said cavity on axially opposite sides thereof and having respective portions radially centrally located in said cavity and capable of variable spacing therebetween, producing threading engagement between axially extending helical threadings constituting parts of, respectively, such portion of second wall means and a cavity-tuning adjusting means rotatable about an axis therefor aligned with said cavity axis, holding said adjusting means while so engaged substantially axially fixed in position relative to such portion of said first wall means, and angularly turning said adjusting means while so held about its axis to produce positive displacements in opposite directions of such portion of said second wall means relative to such portion of said first wall means in response to turning in opposite directions around such axis of such adjusting means.

* * * * *